United States Patent
Hong et al.

(10) Patent No.: US 12,006,209 B2
(45) Date of Patent: Jun. 11, 2024

(54) MEMS AND NEMS STRUCTURES

(71) Applicant: Obsidian Sensors, Inc., San Diego, CA (US)

(72) Inventors: John Hong, La Jolla, CA (US); Tallis Chang, La Jolla, CA (US); Edward Chan, La Jolla, CA (US); Bing Wen, La Jolla, CA (US); Yaoling Pan, La Jolla, CA (US); Sean Andrews, San Diego, CA (US)

(73) Assignee: Obsidian Sensors, Inc., San Diego, CA (US)

( * ) Notice: Subject to any disclaimer, the term of this patent is extended or adjusted under 35 U.S.C. 154(b) by 941 days.

(21) Appl. No.: 16/980,792

(22) PCT Filed: Mar. 14, 2019

(86) PCT No.: PCT/US2019/022338
§ 371 (c)(1),
(2) Date: Sep. 14, 2020

(87) PCT Pub. No.: WO2019/178402
PCT Pub. Date: Sep. 19, 2019

(65) Prior Publication Data
US 2020/0407219 A1    Dec. 31, 2020

Related U.S. Application Data

(60) Provisional application No. 62/642,985, filed on Mar. 14, 2018.

(51) Int. Cl.
*B81B 3/00* (2006.01)
*B81C 1/00* (2006.01)
*G01J 5/20* (2006.01)

(52) U.S. Cl.
CPC ........ *B81C 1/00595* (2013.01); *B81B 3/0081* (2013.01); *B81C 1/0069* (2013.01); *G01J 5/20* (2013.01); *B81B 2201/0207* (2013.01); *B81B 2203/019* (2013.01); *B81C 2201/0105* (2013.01); *B81C 2201/014* (2013.01)

(58) Field of Classification Search
CPC .............. B81C 1/00595; B81C 1/0069; B81C 2201/0105; B81C 2201/014; B81B 3/0081; B81B 2201/0207; B81B 2203/019
See application file for complete search history.

(56) References Cited

U.S. PATENT DOCUMENTS

| | | | |
|---|---|---|---|
| 7,667,200 B1 | 2/2010 | Watts et al. | |
| 2007/0138526 A1* | 6/2007 | Tran | H01L 21/3088 257/E21.235 |
| 2007/0215960 A1 | 9/2007 | Zhu et al. | |
| 2008/0076070 A1 | 3/2008 | Koh et al. | |
| 2011/0111596 A1 | 5/2011 | Kanakasabapathy | |

* cited by examiner

*Primary Examiner* — Walter H Swanson
(74) *Attorney, Agent, or Firm* — Procopio, Cory, Hargreaves & Savitch LLP

(57) ABSTRACT

A method of manufacturing an electromechanical systems structure includes manufacturing sub-micron structural features. In some embodiments, the structural features are less than the lithographic limit of a lithography process.

15 Claims, 14 Drawing Sheets

MEMS AND NEMS STRUCTURES

CROSS REFERENCE TO RELATED APPLICATIONS

This application is a national stage application under 35 U.S.C. § 371 of International Application No. PCT/US2019/022338, filed internationally on Mar. 14, 2019, which claims the benefit of U.S. Provisional Application No. 62/642,985 filed Mar. 14, 2018, the entire contents of which are hereby incorporated herein by reference for all purposes.

FIELD

This disclosure generally relates to microelectromechanical systems ("MEMS"), nanoelectromechanical systems ("NEMS"), and methods of manufacturing MEMS and NEMS. More specifically, this disclosure relates to manufacturing sub-micron features.

BACKGROUND

Low-cost LCD manufacturing methods provide a viable alternative for building large-sized and large-arrayed MEMS and NEMS structures. In such structures, thin film transistors (TFTs) and attached integrated circuits can provide electronics for sensing and actuating.

LCD manufacturing typically uses photolithography, but lithographic capabilities lag standard CMOS fabrication facilities. As a result, when a MEMS or NEMS device requires a narrow linewidth or other features, low-cost LCD manufacturing methods are inferior to CMOS alternatives.

SUMMARY

This disclosure provides methods to produce MEMS or NEMS devices with sub-micron features at low cost. Some embodiments utilize an edge or sidewall approach to pattern structures below the lithographic limit of a lithography process. As disclosed herein, an etch stop layer may be used to separate dependencies among different layers. Separating dependencies may advantageously allow for improved pattern transfer accuracy and more flexibility in material selection.

In some embodiments, a method of manufacturing a MEMS or NEMS structure includes: providing a stack including a structural layer extending in a plane, a sidewall layer including a first portion lying in a plane parallel to the structural layer plane and a second portion lying in a plane transverse to the structural layer plane, an etch-stop layer positioned between the sidewall layer and the structural layer, the etch-stop layer including an etch-selectivity different from an etch-selectivity of the structural layer and an etch-selectivity of the sidewall layer, and a mold comprising a wall parallel to the sidewall layer's second portion; etching the sidewall layer's first portion to expose the etch-stop layer; removing the mold; etching the etch-stop layer such that the sidewall layer's second portion masks a portion of the etch-stop layer; removing the sidewall layer's second portion; and etching the structural layer such that the portion of the etch-stop layer masks a portion of the structural layer.

In some embodiments, providing the structure includes adhering the sidewall layer to the etch stop layer and adhering the etch stop layer to the structural layer.

In some embodiments, providing a structure includes adhering the sidewall layer to the mold such that the sidewall layer's second portion is adhered to the mold; and adhering the sidewall layer to the etch stop layer such that the sidewall layer's first portion is attached to the etch stop layer.

In some embodiments, the method further includes removing the mold after removing the sidewall layer's first portion.

In some embodiments, the method includes patterning the mold using a lithography process. In some embodiments, the sidewall layer's second portion is thinner than a lithographic limit of the lithography process.

In some embodiments, providing a structure includes positioning a sacrificial layer between the structural layer and a substrate. In some embodiments, the method further includes removing the sacrificial layer after etching the structural layer. In some embodiments, providing the stack includes: providing the substrate; after providing the substrate, adhering the sacrificial layer to the substrate; after adhering the sacrificial layer to the substrate, adhering the structural layer to the sacrificial layer; after adhering the structural layer to the sacrificial layer, adhering the etch stop layer to the structural layer; after adhering the etch stop layer to the structural layer, adhering the mold to the etch stop layer; after adhering the mold to the etch stop layer, patterning the mold using a lithography process; and after patterning the mold, adhering the sidewall layer to the mold and to the etch stop layer. In an embodiment where the mold is patterned using a lithography process, the lithographic process has a lithographic limit. In some embodiments, the sidewall layer's second portion is thinner than the lithographic limit of the lithography process. Because the size of this second portion controls (in part) the width of the remaining portion of the structural layer, the remaining portion can advantageously be narrower than the lithographic limit of the lithography process.

In some embodiments, the method further includes: providing a glass substrate; attaching the portion of the structural layer to the glass substrate; and attaching a bolometer pixel to the portion of the structural layer.

In some embodiments, the method further includes providing a MEMS or NEMS device and attaching the portion of the etch-stop layer to the MEMS or NEMS device.

In some embodiments, the portion of the structural layer is less than 250 nm wide.

In some embodiments, a method of manufacturing an electromechanical systems structure includes: providing a first material; depositing a second material which diffuses into the first material to form a third material; and removing one of the first material and the third material.

In some embodiments, providing a first material includes depositing the first material on a substrate. In some embodiments, the second material and third material do not diffuse into the substrate.

In some embodiments, the first material is amorphous silicon and the second material is a metal. In some embodiments, the method includes annealing the second material prior to diffusion of the second material. In some embodiments, the metal is nickel.

In some embodiments, removing one of the first material and the third material includes removing the first material and removing the third material.

In some embodiments, depositing the second material includes depositing, on the first material, a plurality of second material features separated by a first spacing. In some embodiments, the second material diffuses into the first material to form a plurality of third material features separated by a second spacing less than the first spacing. In some embodiments, removing the first material results in a plurality of third material features separated by a gap less than the first spacing. In some embodiments, removing the third material results in a plurality of first material features having a width less than the first spacing.

In some embodiments, depositing the plurality of second material features separated by the first spacing includes: depositing, on the first material, a plurality of fourth material features each with a width equal to the first spacing; depositing the second material on the first material and the fourth material, such that when the second material diffuses into the first material, the third material grows in an in-layer dimension and is bounded by the fourth material in a cross-layer dimension; and removing the fourth material.

In some embodiments, providing the first material includes providing a mold of first material. In some embodiments, depositing the second material includes depositing the second material on a side of the mold. In some embodiments, the second material diffuses into the first material through the side of the mold.

In some embodiments, providing the first material includes providing a fourth material on a side of the mold different than the side where the second material diffuses into the first material. In some embodiments, depositing the second material includes depositing the second material on the fourth material.

In some embodiments, a method uses a lithography process having a lithographic limit, the method includes: providing a layer of a first material; depositing a layer of a second material such that the second material diffuses into the first material to create a third material; and removing one of the first material or the third material to leave feature sizes or feature gaps less than the lithographic limit.

In some embodiments, depositing the second material includes depositing, using the lithography process, a plurality of second material features with gaps less than the lithographic limit.

In some embodiments, providing the first material includes depositing a mold of the first material using the lithography process. In some embodiments, depositing the second material includes depositing the second material on a side of the mold. In some embodiments, the second material diffuses into the first material on the side of the mold.

In some embodiments, a method includes providing a glass substrate; attaching the non-removed first material or a structure manufactured using the non-removed third material (from any of the methods described herein) to the glass substrate; and attaching a bolometer pixel to the non-removed first material or a structure manufactured using the non-removed third material.

In some embodiments, a method includes providing an electromechanical systems device and attaching the non-removed first material or a structure manufactured using the non-removed third material (from any of the methods described herein) to the electromechanical systems device. In some embodiments, the non-removed first material or a structure manufactured using the non-removed third material is less than 250 nm wide.

In some embodiments, a bolometer includes a glass substrate; a structure less than 250 nm wide; and a bolometer pixel coupled to the structure.

Some embodiments utilize material diffusion to pattern structures below the lithographic limit of a lithography process. These embodiments can advantageously use mass-limited conversion processes to define sub-lithography features. In some embodiments, the features are used either as a mask for subsequent fabrication or as the active material.

In some embodiments, a bolometer includes: a glass substrate; a structure manufactured from any of the manufacturing methods described herein; and a bolometer pixel coupled to the structure.

In some embodiments, a method of manufacturing includes: manufacturing a MEMS or NEMS device using a LCD-TFT process; manufacturing a structure by any of the methods described herein; and coupling the structure to the MEMS or NEMS device.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

This disclosure provides methods to produce MEMS or NEMS devices with sub-micron features at low cost. Some embodiments utilize an edge or sidewall to pattern structures below the lithographic limit of a lithography process. As disclosed herein, an etch stop layer may be used to separate dependencies among different layers and improve pattern transfer accuracy. Separating dependencies may advantageously allow for improved pattern transfer accuracy and more flexibility in material selection.

Figure 1:
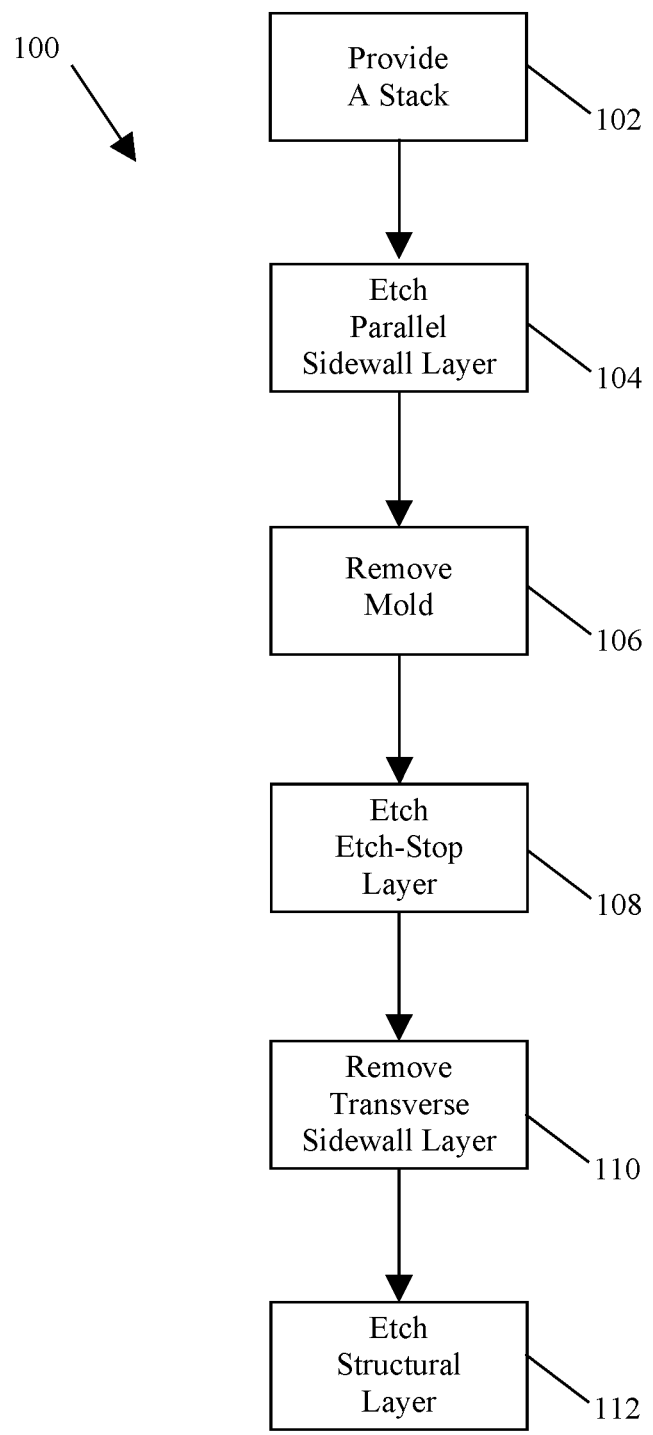
FIG. 1 illustrates a method of manufacturing a MEMS or NEMS structure, in accordance with an embodiment.

FIG. 1 illustrates a method 100 of manufacturing a MEMS or NEMS structure, in accordance with an embodiment. Method 100 includes providing a stack 102, etching a parallel portion of a sidewall layer to expose an etch-stop layer 104, removing a mold 106, etching the etch-stop layer such that a transverse portion of the sidewall layer masks a portion of the etch-stop layer 108, removing the sidewall layer's transverse portion 110, and etching a structural layer such that the portion of the etch-stop layer masks a portion of the structural layer 112. In some embodiments, providing the stack includes providing (1) a structural layer extending in a plane, (2) a sidewall layer including a transverse portion lying in a plane transverse to the structural layer plane and a parallel portion lying in a plane parallel to the structural layer plane, (3) an etch-stop layer positioned between the sidewall layer and the structural layer, the etch-stop layer including an etch-selectivity different from an etch-selectivity of the structural layer and an etch-selectivity of the sidewall layer, and (4) a mold comprising a wall parallel to the sidewall layer's second portion. In some embodiments, the sidewall layer, structural layer, and etch-stop layer abut each other, in some embodiments the mold abuts the sidewall layer and the etch stop layer, and, in some embodiments, additional layer(s) are positioned between the etch stop layer and sidewall layer, between the structural layer and the etch-stop layer, between the etch stop layer and the mold, or between the sidewall layer and the mold.

As used herein, 'etch-selectivity' can be understood to refer to a comparative etch rate of different materials to a specific etchant or etching process. Two materials have different etch-selectivity when the etch rates for the materials differ for a given etchant or etching process. For example, one material layer may etch relatively quickly and the other may etch relatively slowly, or not at all, for the same etchant. In some embodiments, the material of the sidewall layer, structural layer, and etch-stop layer may be chosen so that one etchant has a high etch rate for the sidewall layer and a low etch rate for the etch stop layer, and another etchant has a high etch rate for the etch stop layer and a low etch rate for the structural layer. By adding an etch stop layer with different etch selectivity, embodiments herein may advantageously eliminate or reduce the dependency between the structural layer and the sidewall layer. This may further allow for greater flexibility in structural layer selection and further allow for reusing manufacturing methods for different structural layer materials.

In some embodiments, a parallel portion of the sidewall layer lies in a plane of the layer. In some embodiments, a transverse portion of the sidewall layer does not lie in the same plane as the parallel portion. In some embodiments, the transverse portion is at 90 degrees to the plane of the parallel portion, and in other embodiments the transverse portion lies at a different angle. In some embodiments, the transverse portion lies at an angle between 30 degrees and 130 degrees.

In some embodiments, etching a layer includes anisotropic etching a layer. In some embodiments, the mold is removed after the parallel portion is removed. In some embodiments, the mold is removed before the parallel portion is removed.

In some embodiments, removing the mold includes etching the mold with selectivity for the etch stop layer and sidewall layer. The etch stop layer may advantageously reduce etch selectivity (during mold removal) for the structural layer. Without the etch-stop layer, the mold etch must also be selective for the structural layer. This may influence the choice of structural layer which may be disadvantageous because the structural layer should be optimized for its ultimate function as a MEMS or NEMS structure; accommodating mold etch selectivity may reduce available options for the structural layer.

In some embodiments, the sidewall layer, mold, and etch-stop materials are chosen to achieve a given transverse portion profile, such as an angle and a footing. In some embodiments, the mold height is chosen to achieve a transverse portion height sufficient to transfer the pattern. In some embodiments, mold angles are chosen for adequate step coverage and uniformity of the sidewall layer.

In some embodiments, the transverse portion creates a loop around the mold. In some embodiments, the loops are broken to create separate structural members. In some embodiments, the mold may be capped during etching of the sidewall layer.

In some embodiments, the method includes patterning the mold using a lithography process and the sidewall layer's transverse portion is thinner than a lithographic limit of the lithography process. In some embodiments, a lithographic limit can be understood to be the narrowest line that can be defined in the associated lithography process. In some embodiments, the lithographic limit is 1 µm. In such embodiments, the remaining portion of the structural layer has a width less than the lithographic limit.

In some embodiments, a laser cuts a mold from a deposited layer. Other processes for providing a mold that has a wall parallel to the transverse portion are within the scope of this disclosure. In some embodiments, a transverse portion is a sidewall of the mold wall such that the transverse portion abuts the mold wall.

In some embodiments, providing the structure includes adhering the sidewall layer to the etch stop layer and adhering the etch stop layer to the structural layer. In some embodiments, adhering the sidewall layer/etch stop layer to the etch stop layer/structural layer includes depositing the sidewall layer/etch stop layer on the etch stop layer/structural layer. In some embodiments, the etch selectivity is chosen so that a transfer pattern is precise and does not require a tall transverse portion (which may advantageously reduce shadow effects).

In some embodiments, the portion of the structural layer is less than 250 nm wide. In some embodiments, a "width" of a pattern can be understood to be a dimension of the pattern in the longitudinal dimension of the pattern's layer (i.e., the layer from which the pattern was formed). In some embodiments, the portion of the structural layer is less than 10 nm wide. In some embodiments, a "thickness" of a layer can be understood to be a dimension of the layer perpendicular to the layer's longitudinal dimensions.

It should be appreciated that method 100 (or any method described herein) may not require the recited order of steps. For example, removing the sidewall layer's transverse portion 108 in method 100 could be performed before or after etching a structural layer.

Figure 2:
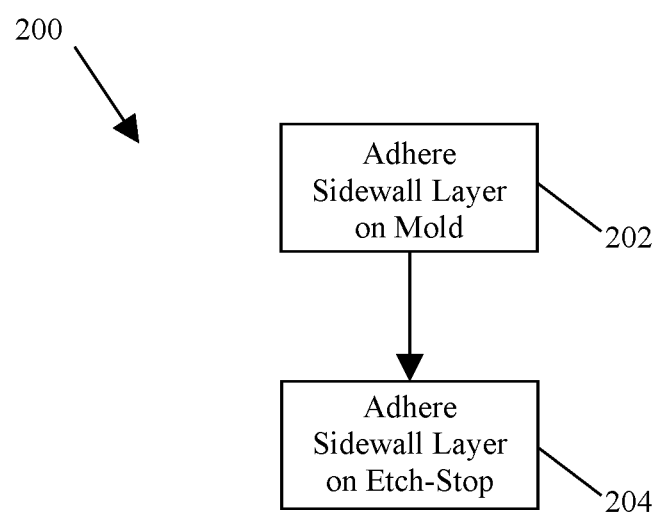
FIG. 2 illustrates a method of manufacturing a MEMS or NEMS structure, in accordance with an embodiment.

FIG. 2 illustrates a method 200 of manufacturing a MEMS or NEMS structure, in accordance with an embodiment. Method 200 may be performed in conjunction with method 100. For example, method 200 may be performed as a portion of step 102 of method 100. In such embodiments, providing a structure includes adhering the sidewall layer to the mold such that the sidewall layer's transverse portion is adhered to the mold 202, and adhering the sidewall layer to the etch-stop layer such that the sidewall layer's parallel portion is attached to the etch-stop layer 204.

Figure 3:
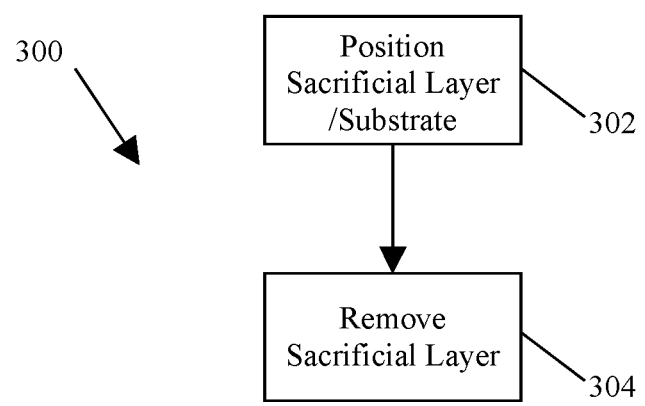
FIG. 3 illustrates a method of manufacturing a MEMS or NEMS structure, in accordance with an embodiment.

FIG. 3 illustrates a method 300 of manufacturing a MEMS or NEMS structure, in accordance with an embodiment. Method 300 may be performed in conjunction with method 100. For example, method 300 may be performed as a portion of step 102 of method 100. In such embodiments, providing a stack 102 includes positioning a sacrificial layer between the structural layer and a substrate 302. In some embodiments, method 300 further includes removing the sacrificial layer after etching the structural layer 304. In some embodiments, providing the stack 102 includes: providing the substrate; after providing the substrate, adhering the sacrificial layer to the substrate; after adhering the sacrificial layer to the substrate, adhering the structural layer to the sacrificial layer; after adhering the structural layer to the sacrificial layer, adhering the etch stop layer to the structural layer; after adhering the etch stop layer to the structural layer, adhering the mold to the etch stop layer; after adhering the mold to the etch stop layer, patterning the mold on the etch stop layer using a lithography process; and after adhering the mold to the etch stop layer, adhering the sidewall layer to the mold and to the etch stop layer, where the sidewall layer's transverse portion is thinner than a lithographic limit of the lithography process.

FIG. 4 illustrates a method 400 of manufacturing a MEMS or NEMS structure, in accordance with an embodiment. In FIG. 4A, a mold 402, the etch stop 404, the structural layer 406, the sacrificial layer 408, and the substrate 410 are added. The layers can be added in any order sufficient to produce the illustrated stack. Layers can be added by deposition or other mechanisms. In some embodiments, the substrate 410 is first provided, the sacrificial layer 408 is then deposited on the substrate 410, the structural layer 406 is then deposited on the sacrificial layer 408, the etch-stop 404 is then deposited on the structural layer 406, and the mold 402 is patterned using lithography. In some embodiments, a height of the mold is determined by a transverse portion height of the sidewall layer required to transfer the narrow pattern faithfully to the etch stop 404. In some embodiments, the wall angles of mold 402 are prepared for adequate step coverage and uniformity of the sidewall layer 412.

In some embodiments, adequate step coverage and uniformity are required for a sidewall layer's transverse portion to remain on the mold after the sidewall layer's parallel portion is removed. Some over-etch of the sidewall layer may be required which may remove some of the transverse sidewall. In some embodiments, a rectangular remaining transverse sidewall is used for etch uniformity, and this may require good step coverage uniformity (as compared to a breadloaf profile, for example, where an upper portion of the sidewall extends further from the mold wall than a lower portion). In some embodiments, the step coverage at the footing is important for the transverse portion to be adequately anchored when the mold is removed. For example, if the step coverage at the footing is inadequate, then the corner where the parallel and transverse sections meet can disadvantageously contain a void which weakens the footing.

Figure 4A:
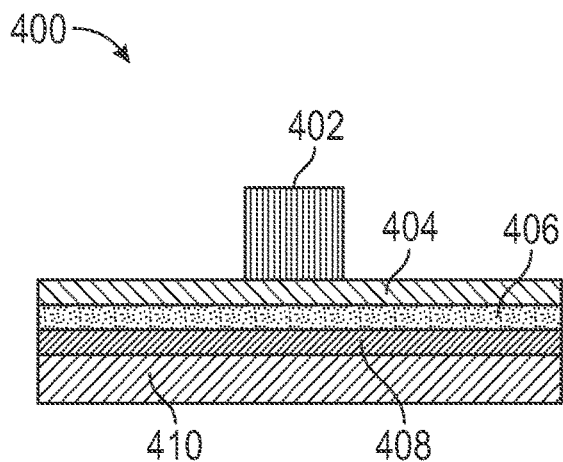
FIGS. 4A-H illustrate a method of manufacturing a MEMS or NEMS structure, in accordance with an embodiment.
Figure 4E:
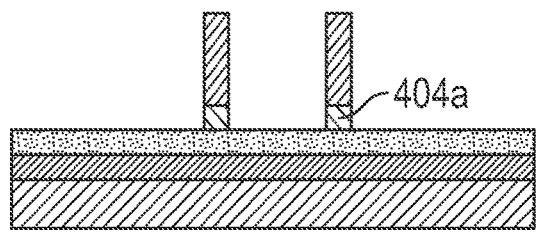
Figure 4B:
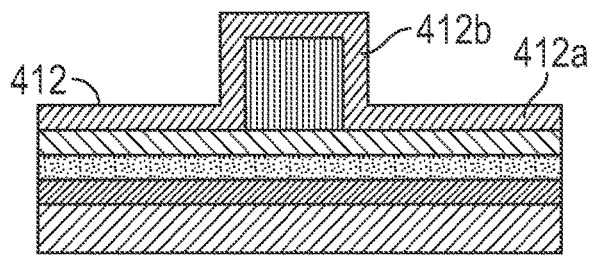

In FIG. 4B, sidewall layer 412 is added to form transverse portion 412(b) around mold 402 and parallel portion 412(a) on etch stop 404. Parallel portion 412(a) lies in a plane parallel to the structural layer's plane and transverse portion 412(a) lies in a plane transverse to the structural layer's plane. In some embodiments, the thickness of the sidewall layer defines the width of the final structure. In some embodiments, the thickness of the sidewall layer 412 is between 50 nm and 1 µm. In some embodiments, the thickness of the sidewall layer is between 50 and 250 nm.

In some embodiments, transverse portion 412(b) extends about 0.5 µm from a surface of etch stop 404 to the other surface. In some embodiments, transverse portion 412(b) extends about 2, 3, or 5 µm from etch stop 404 to the other surface.

Transverse portion 412(b) extends, in a transverse direction, away from the plane of parallel portion 412(a). At least some of transverse portion 412(b) is further from the structural layer 406 than parallel portion 412(a).

In some embodiments, a thickness of the transverse portion 412(b) is determined by the thickness of parallel portion 412(a) multiplied by a coverage factor. In some embodiments, the transverse portion coverage factor is between 0.1 and 1.0.

In some embodiments, mold 402 is amorphous silicon, various organic materials (polyimides, photoresists), moly, an oxide, or a nitride. In some embodiments, mold 402 is between 0.5 and 5 µm thick.

In some embodiments, etch stop 404 is deposited in a plane. In some embodiments, etch stop 404 is aluminum oxide, another oxide, silicon, a nitride, or a metal (e.g., moly, chrome, tungsten). In some embodiments, the material of etch stop 404 is chosen to provide good etch electivity to the mold 402, the structural layer 406, and the sidewall layer 412. In some embodiments, etch stop 404 is chosen to provide good etch selectivity to structural layer 406, and mold 402 and sidewall 412 are chosen to provide good etch selectivity to etch stop 404. For example, in some embodiments, structural layer 406 is silicon or metal and etch stop 404 is metal or silicon, respectively, and mold 402 and sidewall layer 412 are chosen to compliment the chosen etch stop 404. In this way, etch stop 404 may advantageously reduce dependency between structural layer 406 and sidewall layer 412. Reducing dependencies allows for a broader selection of materials for the structural layer 406 and sidewall layer 412 and allows for a broader selection of processes; etch stop 404 allows selection of a material and process that are suitable for the function of the structural portion (406a, described below) without limitation by sidewall layer 412 and mold 402. Etch stop 404 may also advantageously provide for better pattern transfers, particularly with deeper structural patterns (which would require a longer etch and thus a bigger transverse portion without etch stop 404).

In some embodiments, etch stop 404 is between 5 nm to 1 µm thick.

In some embodiments, the structural layer 406 is deposited in a plane. In some embodiments, structural layer 406 is metal, silicon, an oxide, or a nitride. Specific examples include titanium nitride, indium tin oxide, silicon nitride, indium zinc oxide, or amorphous silicon. The thickness of structural layer 406 may be dependent on the function served by the resulting structure. In some embodiments, the thickness of structural layer 406 is between 0.01 to 10 µm.

In some embodiments, sacrificial layer 408 is deposited in a plane and is a polyimide, moly, silicon, carbon, silicon dioxide, germanium, or aluminum. In some embodiments, the thickness of sacrificial layer 408 is between 0.1 to 10 µm.

In some embodiments, substrate 410 is planar and is silicon, glass, stainless steel, or plastic. In some embodiments, the thickness of substrate 410 is between 0.05 to 5 mm and the width of the substrate 410 is from 0.5 inch diameter to 3 m×3 m.

The layers described throughout this disclosure can be deposited by a variety of methods. Such methods include, but are not limited to, CVD (chemical vapor deposition), sputtering, and evaporation.

In some embodiments, a mask is placed over mold 402 so that the sidewall layer 412 does not extend across the top (as shown in FIG. 4) of mold 402 (i.e., only the transverse portion of the sidewall layer contacts the mold). In some embodiments, the mask is a second mold layer providing additional etch selectivity to the transverse portion. The first mold layer can advantageously provide most of the thickness without requiring high etch selectivity.

Figure 4F:
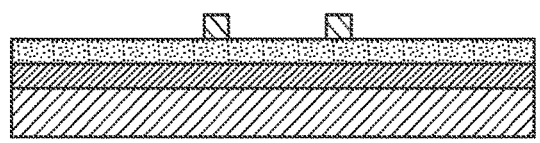
Figure 4C:
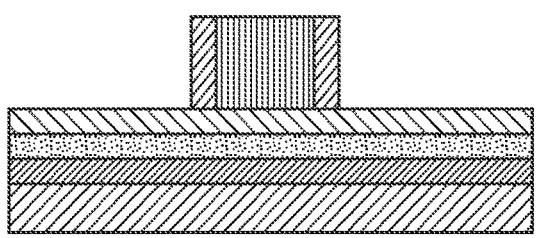

In FIG. 4C, sidewall layer 412 receives an anisotropic etch, resulting in the profile shown (parallel portion 412a removed; transverse portion 412b remains). In some embodiments, the anisotropic etch has good selectivity to the etch-stop 404 and mold 402. In some embodiments, the mold 402 is capped with a material to provide additional etch selectivity (see above). In some embodiments, material properties of sidewall layer 412, mold 402, and etch-stop 404 define the transverse portion profile that is achievable, such as the angle and footing.

Figure 4G:
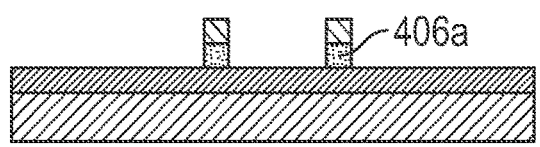
Figure 4D:
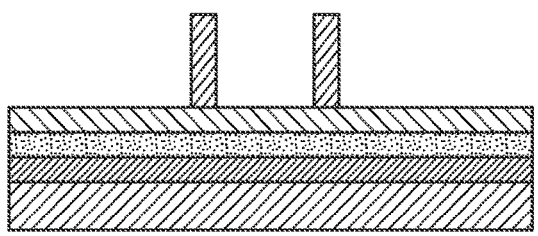

In FIG. 4D, mold 402 is removed. Without etch stop 404, this etch would require selectivity to structural layer 406. Embodiments described herein may provide greater flexibility and accuracy because the structural layer 406 needs to be optimized for its ultimate function; accommodating etch-selectivity of other layers may dilute or compromise that ultimate function. By adding an etch stop 404, etch-selectivity of the structural layer is not a consideration during etching of the sidewall layer.

In FIG. 4E, the transverse portion pattern is transferred to the etch stop 404 to create etch stop pattern 404a. In some embodiments, the width of etch stop pattern 404a is determined by the thickness of transverse portion 412b of the sidewall layer (see exemplary dimensions given above). Since etch stop 404 can be very thin (<10 nm in some cases), the pattern transfer can be precise. In some embodiments, this precision may advantageously reduce the height of the transverse portion, which may otherwise create shadowing effects during etching of the etch stop 404. As a further advantage, embodiments described herein may reduce over-etch of the structural layer 406.

In FIG. 4F, transverse portion 412b is removed leaving a patterned etch stop 404a. In some embodiments, steps (a)-(f) are repeated to add a logical "AND" pattern to the etch stop 404 to create narrow structures along 2 dimensions (e.g. dots). In some embodiments, multiple etch stop layers are used. In some embodiments, an additional etch stop pattern is created on the same layer. This may advantageously reduce the need to double pattern structural layer 406. For example, this method may be used to create an extremely fine dot.

In FIG. 4G, etch stop pattern 404a is transferred to structural layer 406, stopping on the sacrificial material, to create structural pattern 406a. The thin etch stop 404a may advantageously help with precision pattern transfer. In some embodiments, the width of structural pattern 406a is determined by the width of etch stop pattern 404a (see exemplary dimensions given above).

Figure 4H:
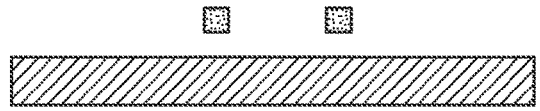

In FIG. 4H, etch stop pattern 404a is removed. In some embodiments, etch stop pattern 404a is discarded. In other embodiments, etch pattern 404a is used in further processing to leverage desirable mechanical, electrical or chemical properties of the etch stop. For example, the etch pattern 404a may be used for surface passivation, or electrical or thermal insulation or conduction, as an infrared absorber, or for mechanical support. Finally, sacrificial layer 408 is removed to release a freestanding structure 406a.

Figure 5:
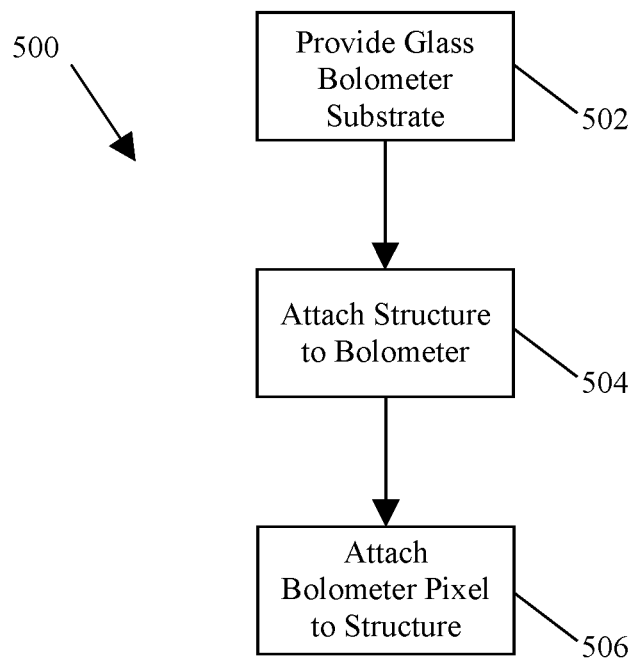
FIG. 5 illustrates a method of manufacturing a MEMS or NEMS structure, in accordance with an embodiment.

FIG. 5 illustrates a method 500 of manufacturing a MEMS or NEMS structure, in accordance with an embodiment. In some embodiments, method 500 is performed in conjunction with method 100. Method 500 includes providing a glass substrate 502, attaching a portion of a structural layer (e.g., a portion of structural layer produced by step 110 in method 100 or a feature created using one of the first material or third material in method 800) to the glass substrate 504, and attaching a bolometer pixel to the portion of the structural layer 506. Methods described herein may be advantageous in glass substrate manufacturing processes because uniformity in glass lithography capabilities is limited. As a further advantage, glass has a high heat capacity and so a glass substrate is a large reservoir of heat; by manufacturing thin structures separating a bolometer pixel from a glass substrate, embodiments herein may better serve as a thermal insulator between the glass substrate and the bolometer pixel.

In some embodiments, method 500 further includes providing a MEMS or NEMS device and attaching the portion of the etch-stop layer to the MEMS or NEMS device.

Figure 6:
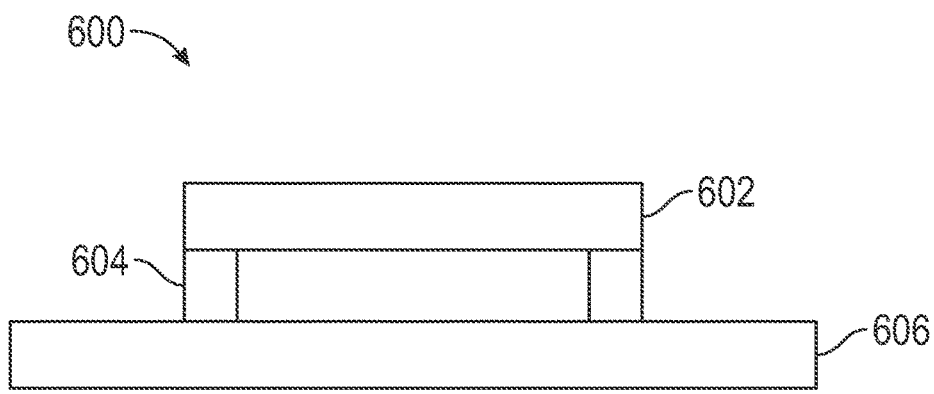
FIG. 6 illustrates a bolometer, in accordance with an embodiment.

FIG. 6 illustrates a bolometer 600, in accordance with an embodiment. Bolometer 600 includes glass substrate 606, structure 604 less than 250 nm wide coupled to glass substrate 606, and a bolometer pixel 602 coupled to the structure 604. In some embodiments of bolometer 600, structure 604 is a hinge that thermally separates the active area from the glass.

In some embodiments, a bolometer includes a glass substrate, a structure manufactured from any of the methods described herein and coupled to the glass substrate, and a bolometer pixel coupled to the structure.

In some embodiments, a bolometer includes a MEMS or NEMS device manufactured by a LCD-TFT manufacturing process and a structure manufactured by any of the methods described herein. In some embodiments, the structure is the etch stop portion described herein.

Figure 7A:
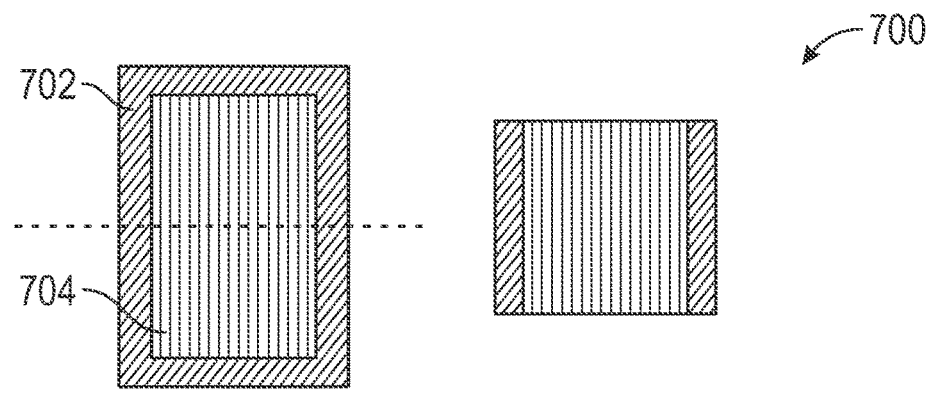
FIGS. 7A-B illustrate methods of manufacturing a MEMS or NEMS structure, in accordance with an embodiment.
Figure 7B:
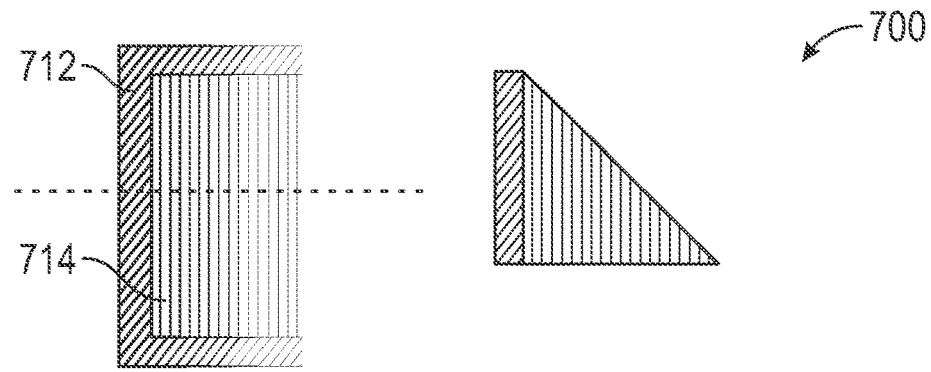

FIG. 7 illustrates a method 700 of manufacturing a MEMS or NEMS structure, in accordance with an embodiment. In some embodiments, sidewalls 702 surround the mold 704 to create complete loops; the structural features are arranged to form complete loops (FIG. 7A), left and right sides are top and side views, respectively). In other embodiments, either the etch stop or the structural layer described herein do not form loops and instead create separate structural members.

In some embodiments, wedge-like molds are created using, for example, greyscale lithography (FIG. 7B), left and right sides are top and side views, respectively). In these embodiments, when the sidewall layer 712 is deposited, the height of the sidewall varies around the mold 714. At the bottom of the wedge of the mold, there is no sidewall, so a loop does not form. Along the other two sides, the sidewall height tapers down. The length of the pattern transferred from such a sidewall to the etch stop layer will depend on the selectivity between the sidewall and etch stop layer.

The sidewall methods described herein may advantageously overcome design rule limitations by using deposited film thickness to create sub-micron feature size in an in-plane dimension. These methods can leverage the difference in anisotropy between deposition and etching processes: a target material is isotropically deposited over a patterned mold layer and followed by an anisotropic etch, such that the material deposited on the sides of the defined mold features remains. Once the mold layer is removed, the sidewall material remaining has length, width, and height dimensions that are controlled by the mold length, film thickness, and mold height, respectively.

Figure 8:
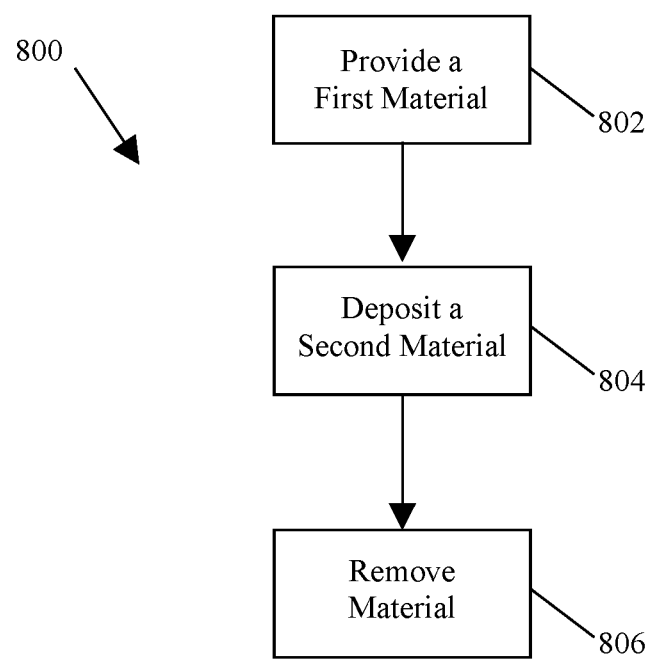
FIG. 8 illustrates a method of manufacturing a MEMS or NEMS structure, in accordance with an embodiment.

FIG. 8 illustrates a method 800 of manufacturing a MEMS or NEMS structure, in accordance with an embodiment. Method 800 includes providing a first material 802, depositing a second material 804 to form a third material, and removing one of the first material and the third material 806. In some embodiments, method 800 advantageously leverages mass-limited conversion processes to define sub-lithography features. These features can be used as a mask for subsequent fabrication or as the active material itself. Advantageously, mass-limited conversion processes are time-independent: the amount of third material can be controlled by the starting amounts of the reactants.

To form the third material, in some embodiments the second material diffuses into the third material. In these embodiments, a finite deposition of second material on a first material allows the second material to diffuse into the first material and create a third material that is a combination of the first and second material and that can grow beyond the width of the second material in an-in layer dimension. In some embodiments, energy is added to the system (e.g., through a temperature rise by annealing) to initiate diffusion of the second material into the first material. The expansion and growth of the third material continues until the first or second material is depleted. In embodiments with energy addition, the expansion and growth can be controlled by removing the energy. For example, where heat is added, growth of the third material may continue until the temperature drops below the third material's formation temperature or the temperature at which diffusion is small. Other examples of energy addition and control includes managing the pressure in the system and/or adding a material to instigate (e.g., a chemical reaction) a material change in one of the first and second material (that starts diffusion). In some embodiments, the second material does not require energy addition to initiate diffusion.

The third material has an etch selectivity to the first material, thereby permitting selective removal of the first or third material. In some embodiments, removing one of the first material and the third material 806 includes removing the first material and removing the third material. In some embodiments, method 800 includes removing residual second material (e.g., second material which did not diffuse into the first material).

In some embodiments, providing a first material 802 includes depositing the first material on a substrate, where the second material and third material do not diffuse into the substrate. The substrate can advantageously provide a diffusion barrier in the cross-plane direction, forcing the conversion process to occur laterally. (In some embodiments, the first material or second material intrinsically promotes in-plane diffusion over cross-plane diffusion.) In some embodiments, the substrate is glass. Other materials (such as silicon nitride and titanium nitride, for example) can be used as a diffusion barrier.

In some embodiments, the first material is amorphous silicon and the second material is a metal. Amorphous silicon may provide some advantages over other options for the first material. For example, there is superior etch selectivity between amorphous silicon and silicides, high defect density lowers the rate of diffusion for fast diffusers (such as $Ni^4$), and the amorphous structure gives no preferred direction of diffusion, causing uniform lateral diffusion. In some embodiments, the metal is nickel. Nickel may be an advantageous metal for this procedure method because is a fast interstitial diffuser in crystalline silicon. In embodiments using amorphous silicon, nickel's fast diffusion can be reduced (and thereby better controlled) by the defects in amorphous silicon.

In some embodiments, the second material includes one of nickel, oxygen, nitrogen, boron, phosphorous, and arsenic. Some embodiments may include annealing the second material (for example, annealing a metal) prior to diffusion of the second material. In an embodiment where the first material is amorphous silicon and the second material is nickel, the conversion temperature for Ni-silicide is below 300 C, which is advantageously below the max temperature for CMOS processes.

Figure 9A:
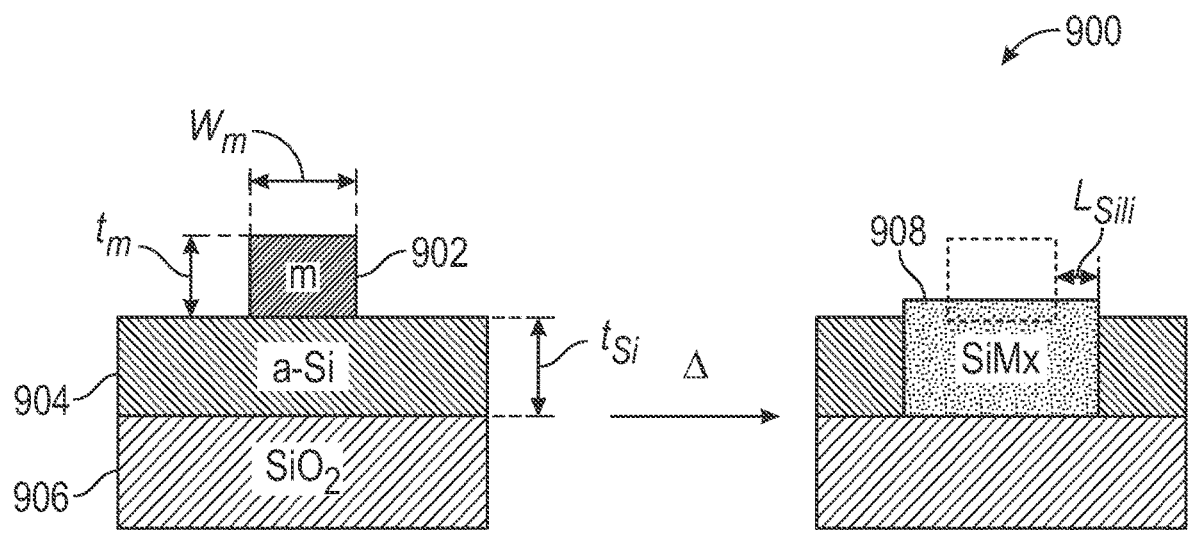
FIGS. 9A and 9B illustrate methods of manufacturing a MEMS or NEMS structure, in accordance with an embodiment.

FIG. 9A illustrates a method 900 of manufacturing a MEMS or NEMS structure, in accordance with an embodiment. Method 900 is a specific example of method 800, using amorphous silicon as the first material 904 and a metal as the second material 902. Method 900 also includes glass as the substrate 906. Although amorphous silicon, metal, and glass are described, it should be appreciated that other materials could be used.

In method 900, metal 902 is patterned on amorphous silicon thin film 904 which is positioned on glass substrate 906. Metal 902 diffuses (after annealing, for example) and reacts with amorphous silicon 904 to form silicide 908. The reaction continues in all directions, but is limited by the diffusion barrier (glass) underneath the amorphous silicon layer. As a result, the reaction is forced to continue laterally until the metal source is exhausted. The result is a silicide pattern in an amorphous silicon matrix with shape and center position of the original metal pattern but spread in each lateral dimension by amount $L_{Sili}$. This difference between in-plane dimensions of the lithographically-defined metal and resulting silicide can be utilized to create and define sub-lithography features.

The lateral spread length of the silicide in one dimension with respect to the metal edge, $L_{Sili}$, can be calculated using the following relation:

$$L_{Sili} = \left[\frac{W_m}{2}\right]\left[\frac{t_m}{t_{Si}} * (C_{Si})^2\right] \quad \text{(Equation 1)}$$

where $W_m$ is the width of the metal/exposed feature, $t_m$ is the metal thickness, and $t_{Si}$ is the amorphous silicon thickness. This equation, which may correspond to the 2D schematic depicted in FIG. 9A, assumes complete conversion with no residual metal remaining. Since there is not an equal amount of consumed metal and silicon for any given silicide, a silicide-specific correction factor $C_{Si}$ can provide more predictability.

In some embodiments, the method includes use of a lithography process having a lithographic limit. In such embodiments, removing one of the first material and third material leaves features sizes or features gaps less than the lithographic limit, respectively.

In some embodiments, depositing the second material includes depositing, on the first material, a plurality of second material features separated by a first spacing, such that the second material diffuses into the first material to form a plurality of third material features separated by a second spacing less than the first spacing. Removing the first material results in a plurality of third material features separated by a gap less than the first spacing. Removing the third material results in a plurality of first material features having a width less than the first spacing.

Figure 9B:
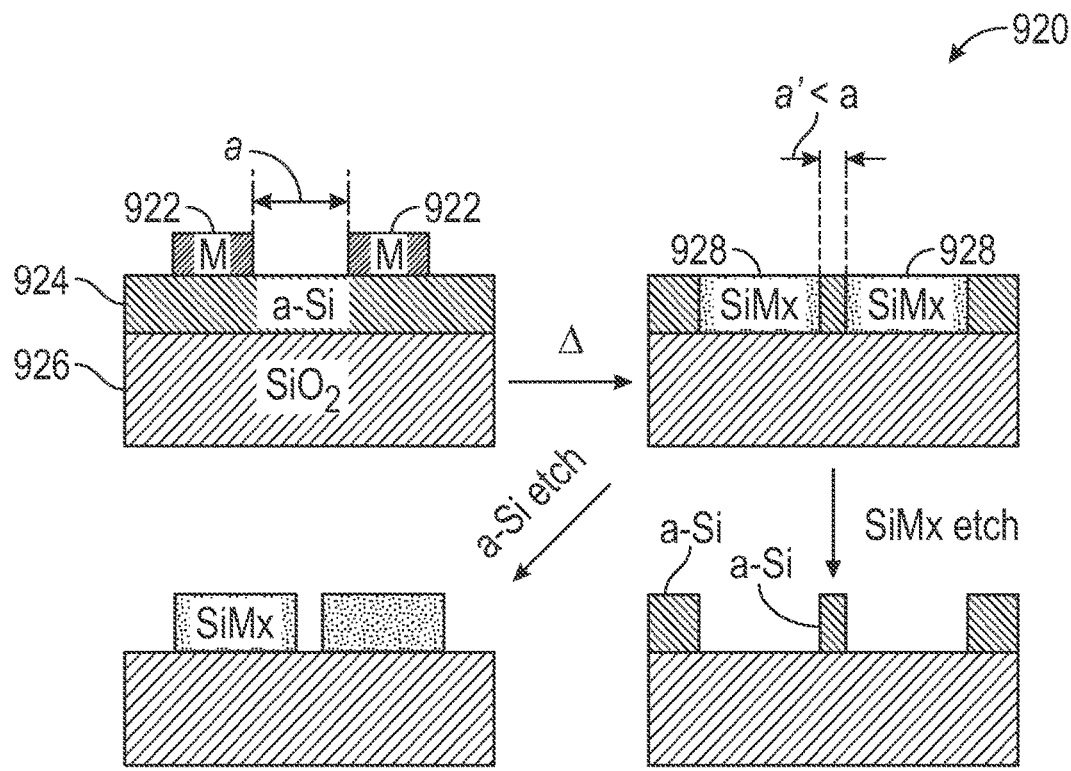

FIG. 9B illustrates a method 920 of manufacturing a MEMS or NEMS structure, in accordance with an embodiment. In method 920, metal 922 is patterned with pitch "a". After metal 922 reacts with amorphous silicon 924, the resultant pitch between the patterned silicide 928 is a' (a'<a). As shown in FIG. 9B, removal of either the amorphous silicon or silicide results in either positive or negative pattern transfer, where the former creates a trench (gap) and the latter forms a strip. Assuming the original pitch "a" is set at the lithography limit, the dimension of either resulting feature (trench or strip) is smaller than that lithography limit.

Returning to Equation 1, $L_{Sili}$ is proportional both to the ratio of metal to available amorphous silicon and to the width of the metal layer. These dependencies can cause pattern-related consequences. For example, consider method 920. The width of the metal lines may be limited by the following relation:

$$a' = a - W_m \left( \frac{t_m}{t_{Si}} * (C_{Si})^2 \right) \quad \text{(Equation 2)}$$

where "a" is the edge-to-edge distance between deposited metal features and a' is the edge-to-edge distance between desired silicide features. Assuming that "a" is the resolution limit of a given lithography process, then the metal width and metal/Si ratio may be limited by the following relations:

$$a \le W_m \le \frac{a}{\left( \frac{t_m}{t_{Si}} * (C_{Si})^2 - 1 \right)} \quad \text{(Equation 3)}$$

and $$\frac{t_m}{t_{Si}} * (C_{Si})^2. \quad \text{(Equation 4)}$$

Figure 10:
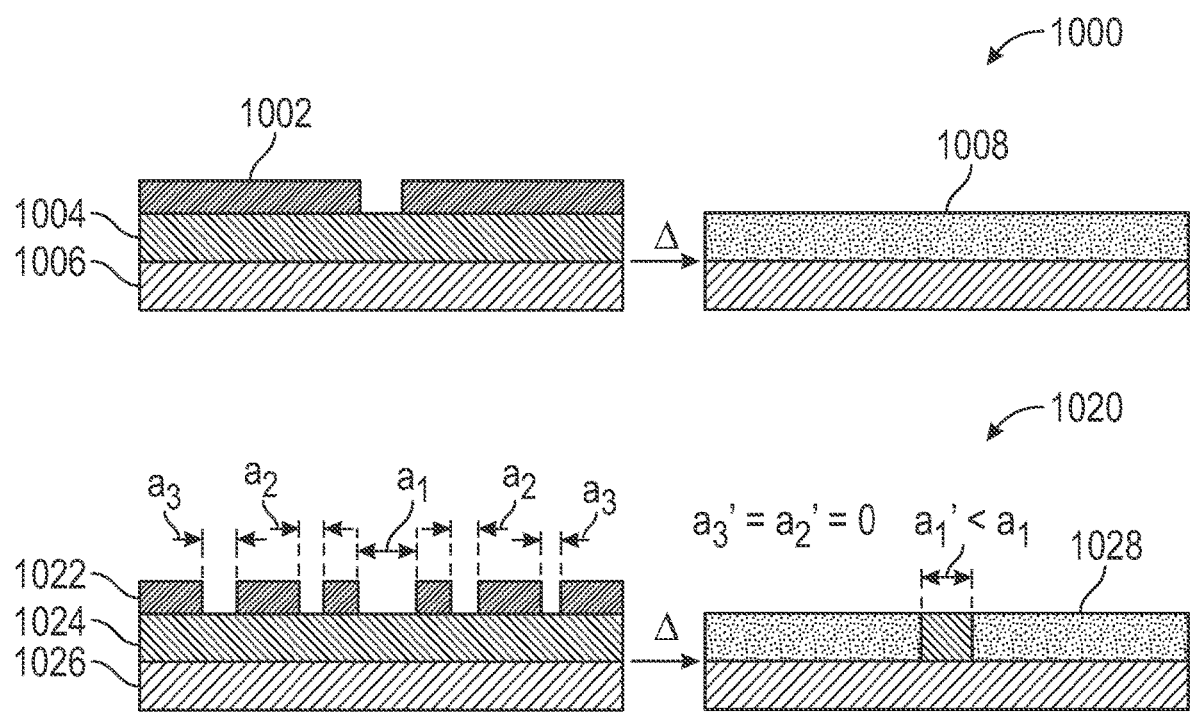
FIG. 10 illustrates methods of manufacturing a MEMS or NEMS structure, in accordance with an embodiment.

FIG. 10 illustrates methods 1000 and 1020 of manufacturing a MEMS or NEMS structure, in accordance with an embodiment. Method 1000 demonstrates a process for creating a continuous portion of a layer using method 800. In method 1000, second material 1002 is patterned on first material 1004 to leave a gap between second material features. When second material 1002 reacts with first material 1004, reaction expands to fill the gap between the second material 1002 features, resulting in a continuous portion of third material 1008. Method 1020 demonstrates a process for making a feature of desired width $a_1'$ in third material 1028. In method 1020, additional patterns of second material 1022 separated by various gaps ($a_2, a_3, \ldots$) combine to react with first material 1024 to leave no gaps ($a_2', a_3', \ldots = 0$) and elsewhere the first and second material combine to provide non-zero gap $a_1'$.

Figure 11:
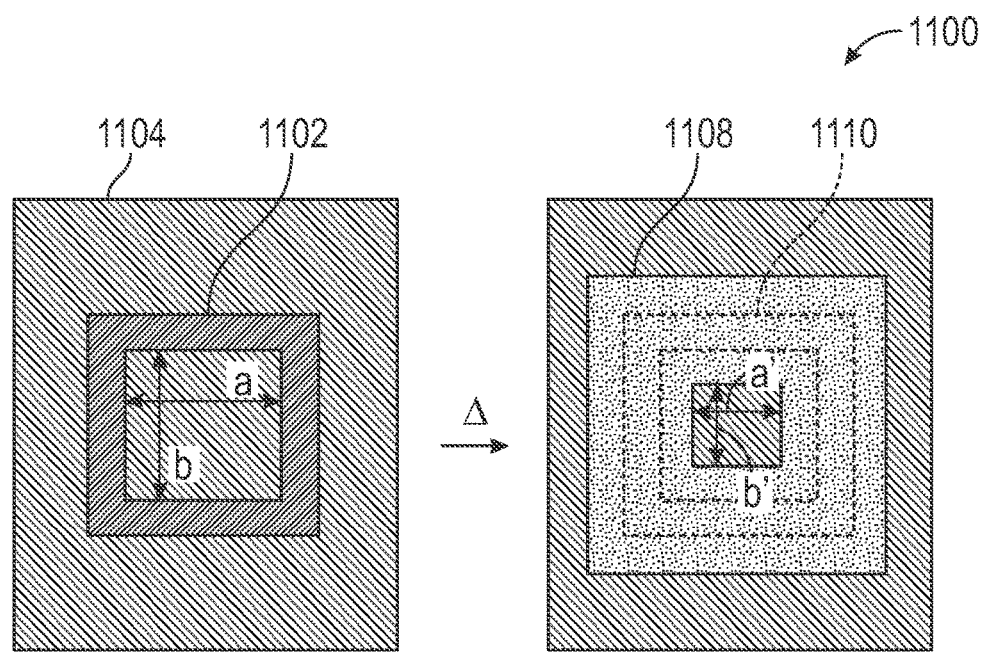
FIG. 11 illustrates a method of manufacturing a MEMS or NEMS structure, in accordance with an embodiment.

FIG. 11 illustrates a method 1100 of manufacturing a MEMS or NEMS structure, in accordance with an embodiment. Method 1100 can create features that are smaller than the lithography limit in both in-plane dimensions simultaneously. Any of the methods described herein can be used with method 1100. Method 1100 illustrates first material 1104 with second material 1102 patterned on first material 1104. Second material 1102 is patterned in two dimensions, with the features separated by gap "a" in one dimension and gap "b" in the other dimension; second material 1102 and first material 1104 combine to make third material 1108 with gap a' and gap b', respectively. Outline 1110 repeats the outline of second material 1102 in the left-hand image and is provided to illustrate the differences between the size of the two dimensional second material pattern and the two dimensional third material pattern.

Figure 12:
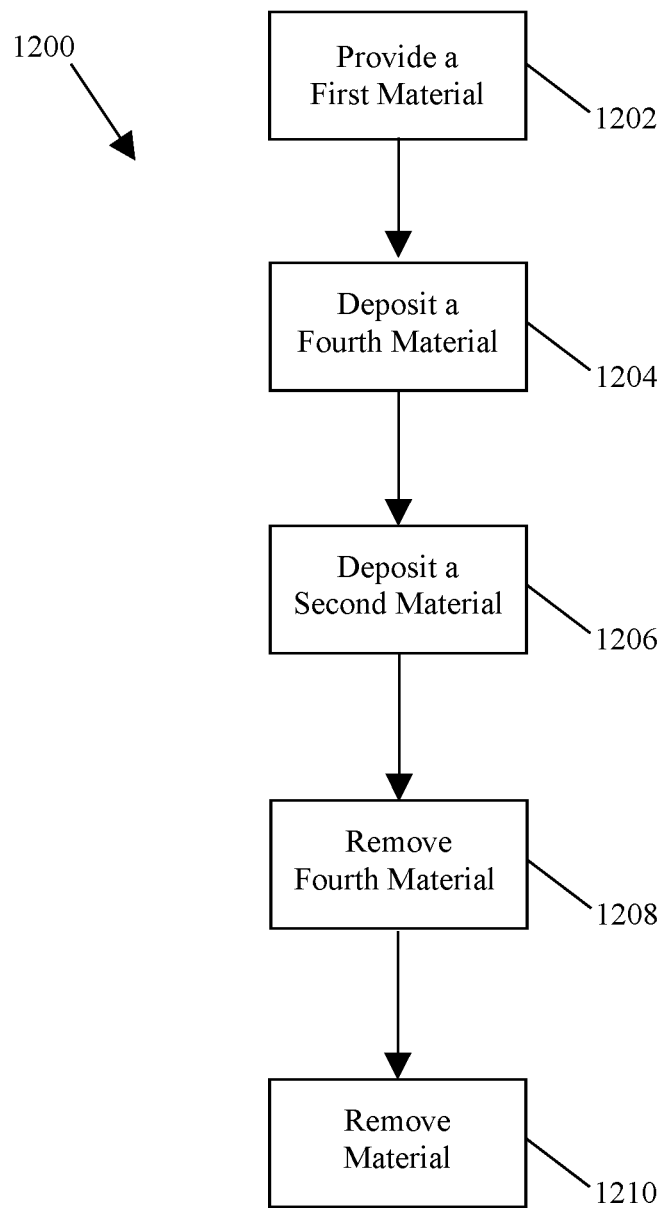
FIG. 12 illustrates a method of manufacturing a MEMS or NEMS structure, in accordance with an embodiment.

FIG. 12 illustrates a method 1200 of manufacturing a MEMS or NEMS structure, in accordance with an embodiment. In some embodiments, method 1200 is performed in conjunction with method 800, 900, 1000, 1100, or a combination of these methods. Method 1200 includes providing a first material 1202; depositing, on the first material, a plurality of fourth material features each with a width equal to a first spacing 1204; depositing a second material on the first material and the fourth material 1206, such that when the second material diffuses into the first material, the third material grows in an in-layer dimension and is bounded by the fourth material in a cross-layer dimension; removing the fourth material 1208; and removing one of the first material and the third material 1210.

Figure 13:
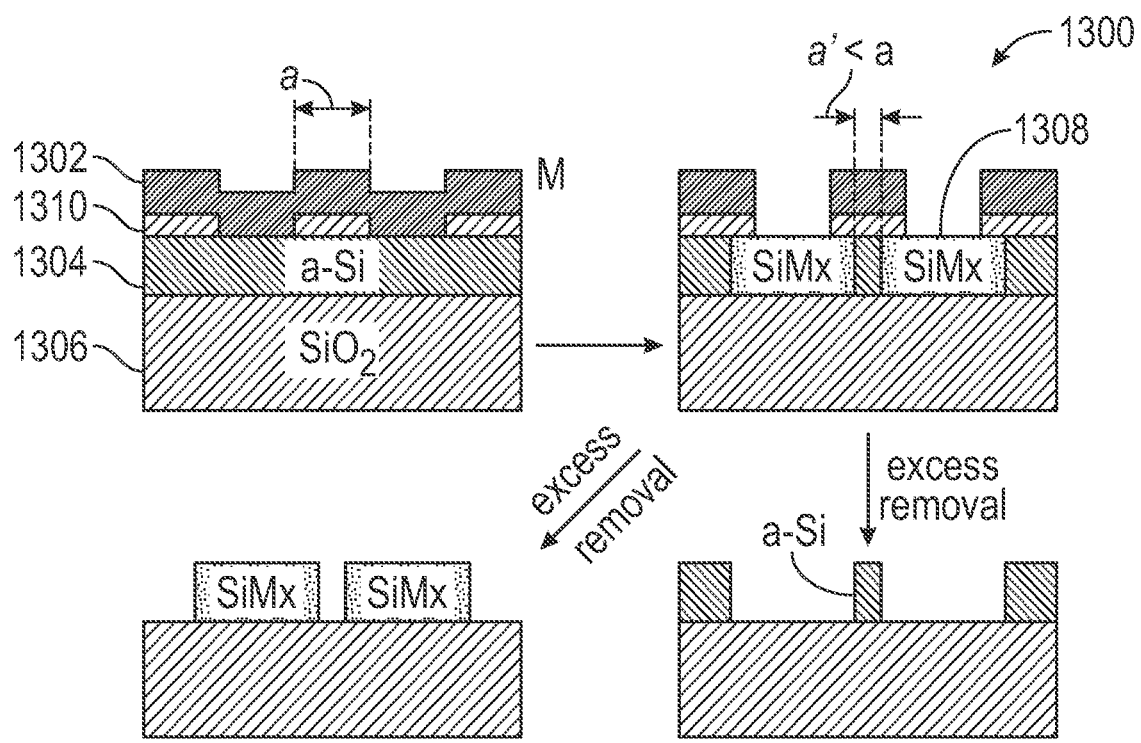
FIG. 13 illustrates a method of manufacturing a MEMS or NEMS structure, in accordance with an embodiment.

FIG. 13 illustrates a method 1300 of manufacturing a MEMS or NEMS structure, in accordance with an embodiment. In method 1300, first material 1304 is amorphous silicon, second material 1302 is metal, substrate 1306 is glass, and fourth material 1310 is an oxide. Here, the metal/amorphous silicon interface is controlled through openings in the sandwiched oxide layer, allowing for blanket metal deposition, and creating silicide 1308. Sub-lithography resolution feature can be left remaining after subsequent removal of the metal, oxide, and either amorphous silicon or silicide.

Figure 14:
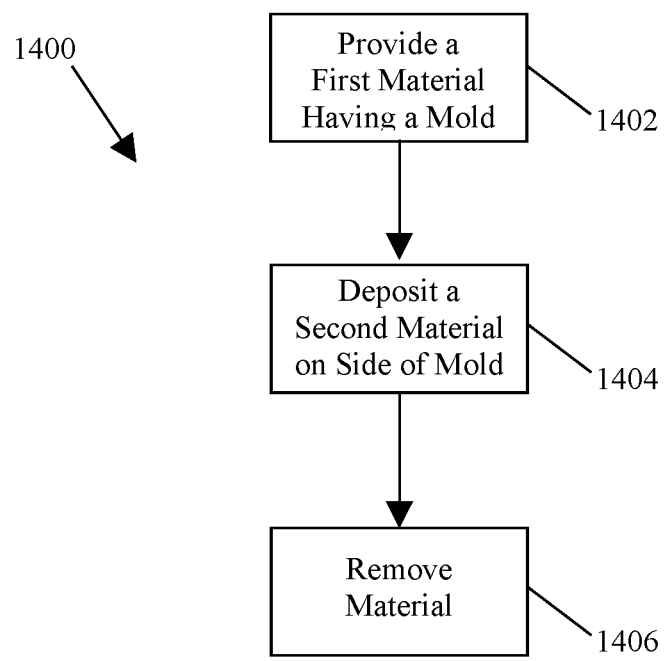
FIG. 14 illustrates a method of manufacturing a MEMS or NEMS structure, in accordance with an embodiment.

FIG. 14 illustrates a method 1400 of manufacturing a MEMS or NEMS structure, in accordance with an embodiment. In some embodiments, method 1400 is performed in conjunction with method 800, 900, 1000, 1100, 1200, 1300, or a combination of these methods. Method 1400 includes providing a first material with a mold 1402; depositing a second material on a side of the mold 1404, such that the second material diffuses into the first material through the side of the mold to form a third material; and removing one of the first material and the third material 1406.

In some embodiments, providing the first material 1402 includes providing a fourth material on a side of the mold different than the side where the second material diffuses into the first material and depositing the second material 1404 includes depositing the second material on the fourth material. In method 1400, since the conversion starts from exposed edges of the amorphous silicon mold stack, the lateral silicide feature size is dictated simply by the metal sidewall thickness, $t_{ms}$: $L_{Sili} = t_{ms} C_{Si}^2$ (Equation 5) assuming that the metal source available for conversion is limited to that which is deposited on the sidewall. Metal diffusion from farther sources, e.g. metal located on the glass surface near the amorphous silicon/metal interface, may not meaningfully contribute due to the small connected cross-section.

In some embodiments, method 1400 includes use of a lithography process having a lithographic limit and depositing a mold of the first material using the lithography process. Depositing the second material can include depositing the second material on a side of the mold, where the second material diffuses into the first material on the side of the mold. In such embodiments, removing one of the first material and third material leaves features sizes or features gaps less than the lithographic limit, respectively.

Figure 15:
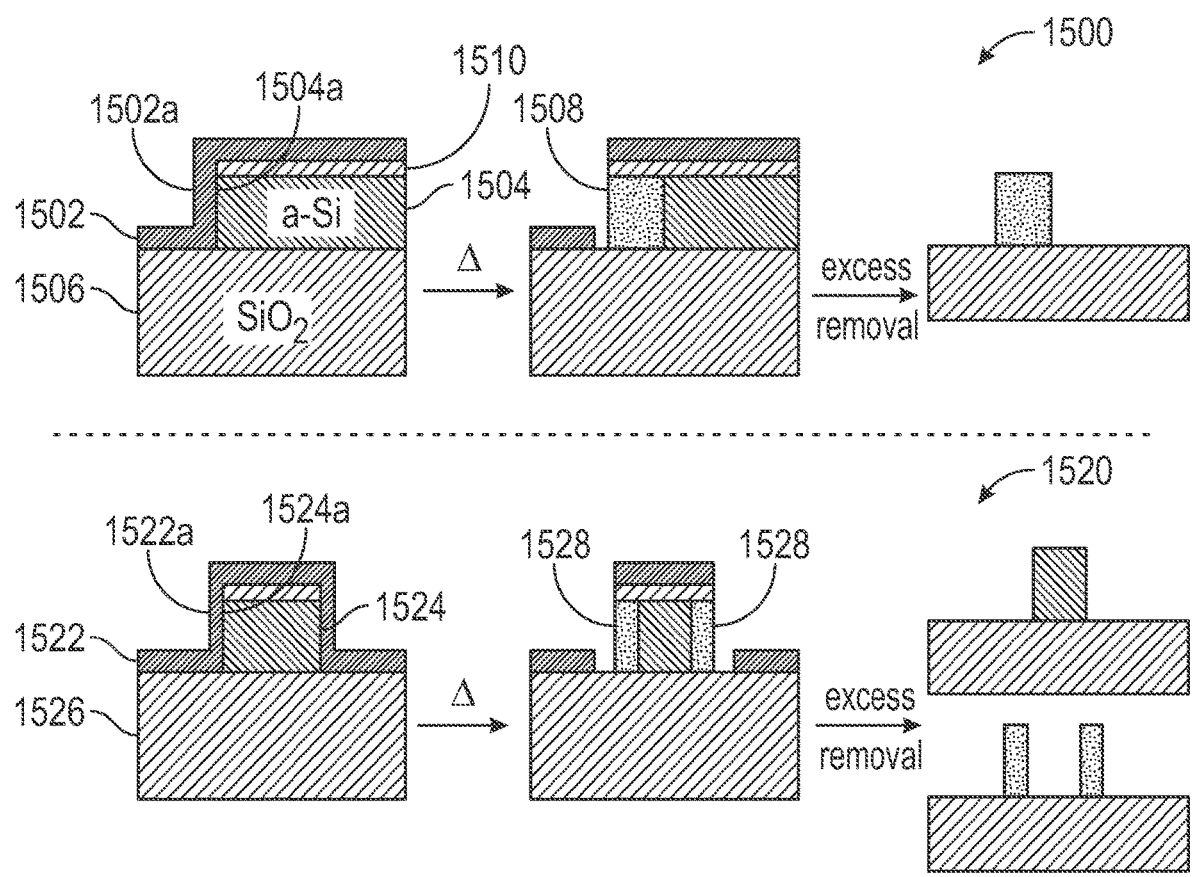
FIG. 15 illustrates methods of manufacturing a MEMS or NEMS structure, in accordance with an embodiment.

FIG. 15 illustrates method 1500 of manufacturing a MEMS or NEMS structure, in accordance with an embodiment. In method 1500, metal 1502 is deposited on mold 1504. The side 1504a of mold 1504 is exposed and sidewall 1502a of metal 1502 contacts side 1504a. As depicted in 1500, the only area that allows for diffusion and silicide conversion is where a metal makes direct contact with the amorphous silicon on side 1504a. The added top oxide 1510 can act as a diffusion barrier to prevent non-lateral silicide formation and diffusion (similar to the processes described above with respect to methods 1200 and 1300). By defining where intimate contact can be made (by opening specific areas via patterned etching, followed by isotropic metal deposition), single features of silicide can be created with subsequent annealing and material removal steps. In method 1520, two sides from the same lithographically-defined feature provide amorphous silicon/metal contact. Thus, in method 1520, silicide formation will occur on both sides, leaving the possibility of creating two features.

The herein-described processes, involving combinations of a first and second material to create a third material, provide a number of advantages. These processes can create features in multiple dimensions. These processes are time-independent, limited by the size of the first and second material. In these processes, the profile of the third material is easily controlled.

Figure 16:
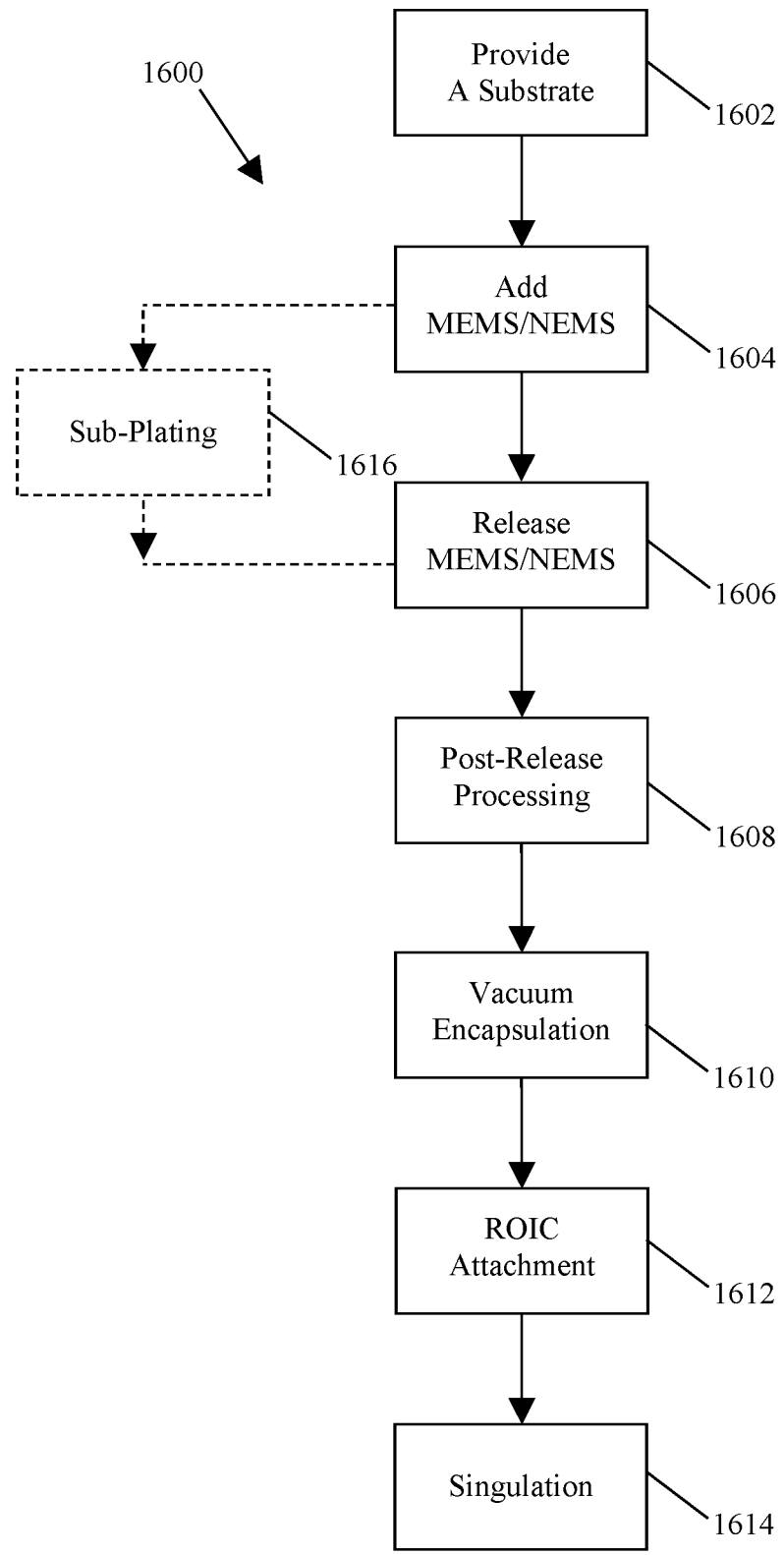
FIG. 16 illustrates a method 1600 of manufacturing an electromechanical system, in accordance with an embodiment.

FIG. 16 illustrates a method 1600 of manufacturing an electromechanical system, in accordance with an embodiment. To manufacture an electromechanical system, all or some of the process steps in method 1600 could be used and used in a different order.

Method 1600 includes Step 1602, providing a substrate. In some embodiments, the substrate is made of glass. In some embodiments, the substrate is low temperature polycrystalline silicon. In some embodiments, the substrate is a borosilicate that contains additional elements to fine tune properties. An example of a borosilicate is by Corning Eagle™, which produces an alkaline earth boro aluminosilicate (a silicate loaded with boron, aluminum, and various alkaline earth elements). Other variations are available from Asahi Glass™ or Schott™.

In some embodiments, a flat panel glass process is used to manufacture the electromechanical system. In some embodiments, a liquid crystal display (LCD) process is used to manufacture the electromechanical system. In some embodiments, an OLED display process or an x-ray panels process is used. Employing a flat panel glass process may allow for increased substrate sizes, thereby allowing for a higher number of electromechanical systems per substrate, which reduces processing costs. "Panel level" sizes can include 620 mm×750 mm, 680 mm×880 mm, 1100 mm×1300 mm, 1300 mm×1500 mm, 1500 mm×1850 mm, 1950 mm×2250 mm, and 2200 mm×2500 mm. Further, thin film transistors (TFTs) in panel level manufacturing can also reduce cost and so, for example, LCD-TFT processes can be beneficial.

Method 1600 includes Step 1604, adding MEMS or NEMS to the substrate. Although MEMS/NEMS are used to describe the addition of structures, it should be appreciated that other structures could be added without deviating from the scope of this disclosure. In embodiments using panel level processing, the MEMS/NEMS structures may be added using an LCD-TFT process.

Step 1604 may be followed by optional Step 1616, sub-plating. Step 1616 may be used when the substrate is larger than the processing equipment used in subsequent steps. For example, if using a panel level process (such as LCD), some embodiments will include (at Step 1604) cutting the panel into to wafer sizes to perform further processing (using, for example, CMOS manufacturing equipment). In other embodiments, the same size substrate is used throughout method 1600 (i.e., Step 1616 is not used).

Method 1600 includes Step 1606, releasing the MEMS/NEMS from the substrate.

Method 1600 includes Step 1608, post-release processing. Such post-release processing may prepare the MEMS/NEMS structure for further process steps, such as planarization. In wafer-level processing, planarization can include chemical mechanical planarization. In some embodiments, the further process steps include etch back, where a photoresist is spun onto the topography to generate a more planar surface, which is then etched. Higher control of the etch time can yield a smoother surface profile. In some embodiments, the further process steps include "spin on glass," where glass-loaded organic binder is spun onto the topography and the result is baked to drive off organic solvents, leaving behind a surface that is smoother.

Method 1600 includes Step 1610, vacuum encapsulation of the MEMS/NEMS structure, where necessary. Vacuum encapsulation may be beneficial to prolong device life.

Method 1600 includes Step 1612, attachment of a readout integrated circuit (ROIC) and flex/PCB attachment. Processes and devices described herein may have the further advantage that the area required for signal processing can be much smaller than the sensing area which is dictated by the sensing physics. More often than not, CMOS is chosen with a technology node that is not so good for signal processing, so this leads to a further problem that the signal processing is not implemented in the best technology. Processes described herein can use a more suitable CMOS and drive down the area, then use a better sensing area and exploit the low cost of FPD (flat panel display) manufacturing. In some embodiments, the ROIC in specifically designed for sensing a specific electromagnetic wavelength (such as X-Rays, THz, LWIR).

Method 1600 includes Step 1614, singulation. Some embodiments may include calibration and chip programming, which may take into account the properties of the sensors. Methods described herein may be advantageous in glass substrate manufacturing processes because uniformity in glass lithography capabilities is limited. As a further advantage, glass has a high heat capacity and so a glass substrate is a large reservoir of heat; by manufacturing thin structures separating a bolometer pixel from a glass substrate, embodiments herein may better serve as a thermal insulator between the glass substrate and the bolometer pixel.

In some embodiments, a bolometer is manufactured using method 1600. FIG. 6 illustrates an exemplary bolometer. Bolometers can be used in a variety of applications. For example, long wave infra-red (LWIR, wavelength of approximately 8-14 μm) bolometers can be used in the automotive and commercial security industries. For example, LWIR bolometers with QVGA, VGA, and other resolution. Terahertz (THz, wavelength of approximately 1.0-0.1 mm) bolometers can be used in security (e.g., airport passenger security screening) and medical (medical imaging). For example, THz bolometers with QVGA resolution and other resolutions. Some electrochemical systems can include X-Ray sensors or camera systems. Similarly, LWIR and THz sensors are used in camera systems. Some electromechanical systems are applied in medical imaging, such as endoscopes and exoscopes.

Other electromechanical systems include scanners for light detection and ranging (LIDAR) systems. For example, optical scanners where spatial properties of a laser beam could be shaped (for e.g., beam pointing). Electromechanical systems include inertial sensors (e.g., where the input stimulus is linear or angular motion). Some systems may be used in bio sensing and bio therapeutic platforms (e.g., where biochemical agents are detected).

In some aspects, a method of manufacturing a MEMS or NEMS structure includes: providing a stack including a structural layer extending in a plane, a sidewall layer including a first portion lying in a plane parallel to the structural layer plane and a second portion lying in a plane transverse to the structural layer plane, an etch-stop layer positioned between the sidewall layer and the structural layer, the etch-stop layer including an etch-selectivity different from an etch-selectivity of the structural layer and an etch-selectivity of the sidewall layer, and a mold comprising a wall parallel to the sidewall layer's second portion; etching the sidewall layer's first portion to expose the etch-stop layer; removing the mold; etching the etch-stop layer such that the sidewall layer's second portion masks a portion of the etch-stop layer; removing the sidewall layer layer's second portion; and etching the structural layer such that the portion of the etch-stop layer masks a portion of the structural layer.

In some aspects, providing the structure in the aspects above includes adhering the sidewall layer to the etch stop layer and adhering the etch stop layer to the structural layer.

In some aspects providing a structure in any of the aspects above includes adhering the sidewall layer to the mold such that the sidewall layer's second portion is adhered to the mold; and adhering the etch stop layer to the structural layer such that the sidewall layer's first portion is attached to the etch stop layer.

In some aspects, the method in any of the aspects above further includes removing the mold after removing the sidewall layer's first portion.

In some aspects, the method in any of the aspects above includes patterning the mold using a lithography process. In some aspects, the sidewall layer's second portion is thinner than a lithographic limit of the lithography process.

In some aspects, providing a structure in any of the aspects above includes positioning a sacrificial layer between the structural layer and a substrate. In some aspects, the method in the previous aspect further includes removing the sacrificial layer after etching the structural layer. In some aspects, providing the stack in any of the two previous aspects includes: providing the substrate; after providing the substrate, adhering the sacrificial layer to the substrate; after adhering the sacrificial layer to the substrate, adhering the structural layer to the sacrificial layer; after adhering the structural layer to the sacrificial layer, adhering the etch stop layer to the structural layer; after adhering the etch stop layer to the structural layer, adhering the mold to the etch stop layer; after adhering the mold to the etch stop layer, patterning the mold using a lithography process, wherein the sidewall layer's second portion is thinner than a lithographic limit of the lithography process; and after patterning the mold, adhering the sidewall layer to the mold and to the etch stop layer.

In some aspects, the method of any of the aspects above further includes: providing a glass substrate; attaching the portion of the structural layer to the substrate; and attaching a bolometer pixel to the portion of the structural layer.

In some aspects, the method in any of the aspects above further includes providing a MEMS or NEMS device; and attaching the portion of the etch-stop layer to the MEMS or NEMS device.

In some aspects, the portion of the structural layer in any of the aspects described above is less than 250 nm wide.

In some aspects, a method of manufacturing an electro-mechanical systems structure includes: providing a first material; depositing a second material which diffuses into the first material to form a third material; and removing one of the first material and the third material.

In some aspects, providing a first material includes depositing the first material on a substrate. In some aspects, the second material and third material do not diffuse into the substrate.

In some aspects, the first material is amorphous silicon and the second material is a metal. In some aspects, the method includes annealing the second material prior to diffusion of the second material. In some aspects, the metal is nickel.

In some aspects, removing one of the first material and the third material includes removing the first material and removing the third material.

In some aspects, depositing the second material includes depositing, on the first material, a plurality of second material features separated by a first spacing. In some aspects, the second material diffuses into the first material to form a plurality of third material features separated by a second spacing less than the first spacing. In some aspects, removing the first material results in a plurality of third material features separated by a gap less than the first spacing. In some aspects, removing the third material results in a plurality of first material features having a width less than the first spacing.

In some aspects, depositing the plurality of second material features separated by the first spacing includes: depositing, on the first material, a plurality of fourth material features each with a width equal to the first spacing; depositing the second material on the first material and the fourth material, such that when the second material diffuses into the first material, the third material grows in an in-layer dimension and is bounded by the fourth material in a cross-layer dimension; and removing the fourth material.

In some aspects, providing the first material includes providing a mold of first material. In some aspects, depositing the second material includes depositing the second material on a side of the mold. In some aspects, the second material diffuses into the first material through the side of the mold.

In some aspects, providing the first material includes providing a fourth material on a side of the mold different than the side where the second material diffuses into the first material. In some aspects, depositing the second material includes depositing the second material on the fourth material.

In some aspects, a method uses a lithography process having a lithographic limit, the method includes: providing a layer of a first material; depositing a layer of a second material such that the second material diffuses into the first material to create a third material; and removing one of the first material or the third material to leave feature sizes or feature gaps less than the lithographic limit.

In some aspects, depositing the second material includes depositing, using the lithography process, a plurality of second material features with gaps less than the lithographic limit.

In some aspects, providing the first material includes depositing a mold of the first material using the lithography process. In some aspects, depositing the second material includes depositing the second material on a side of the mold. In some aspects, the second material diffuses into the first material on the side of the mold.

In some aspects, a method includes providing a glass substrate; attaching the non-removed first material or a structure manufactured using the non-removed third material (from any of the aspects described above) to the glass substrate; and attaching a bolometer pixel to the non-removed first material or a structure manufactured using the non-removed third material.

In some aspects, a method includes providing an electromechanical systems device and attaching the non-removed first material or a structure manufactured using the non-removed third material (from any of the aspects described above) to the electromechanical systems device. In some aspects, the non-removed first material or a structure manufactured using the non-removed third material is less than 250 nm wide.

In some aspects, a bolometer includes a glass substrate; a structure less than 250 nm wide; and a bolometer pixel coupled to the structure.

In some aspects, a bolometer includes: a glass substrate; a structure manufactured from any of the methods described herein; and a bolometer pixel coupled to the structure.

In some aspects, a method of manufacturing includes: manufacturing a MEMS or NEMS device using a LCD-TFT process; manufacturing a structure by any of the methods described herein; and coupling the structure to the MEMS or NEMS device.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

We claim:

1. A method of manufacturing an electromechanical systems structure comprising:
   providing a stack, wherein the stack comprises:
      a structural layer extending in a plane,
      a sidewall layer comprising:
         a first portion lying in a plane parallel to the structural layer plane and
         a second portion lying in a plane transverse to the structural layer plane,
      an etch-stop layer, positioned between the sidewall layer and the structural layer,
         comprising an etch-selectivity different from an etch-selectivity of the structural layer and an etch-selectivity of the sidewall layer, and
      a mold comprising a wall parallel to the sidewall layer's second portion;
   positioning a sacrificial layer between the structural layer and a substrate;
   etching the sidewall layer's first portion to expose the etch-stop layer;
   removing the mold;
   etching the etch-stop layer such that the sidewall layer's second portion masks a portion of the etch-stop layer;
   removing the sidewall layer's second portion; and
   etching the structural layer such that the portion of the etch-stop layer masks a portion of the structural layer.

2. The method of claim 1, wherein providing the structure comprises:
   adhering the sidewall layer to the etch stop layer; and
   adhering the etch stop layer to the structural layer.

3. The method of claim 1, wherein providing the structure comprises:
   adhering the sidewall layer to the mold such that the sidewall layer's second portion is adhered to the mold; and
   adhering the sidewall layer to the etch-stop layer such that the sidewall layer's first portion is attached to the etch-stop layer.

4. The method of claim 1, further comprising removing the mold after removing the sidewall layer's first portion.

5. The method of claim 1, further comprising patterning the mold using a lithography process, wherein the sidewall layer's second portion is thinner than a lithographic limit of the lithography process.

6. The method of claim 1, further comprising:
   providing a glass substrate;
   attaching the portion of the structural layer to the glass substrate; and
   attaching a bolometer pixel to the portion of the structural layer.

7. The method of claim 1, further comprising:
   providing an electromechanical systems device; and
   attaching the portion of the etch stop layer to the electromechanical systems device.

8. The method of claim 1, further comprising:
   manufacturing an electromechanical systems device by LCD-TFT; and
   coupling the structure to the electromechanical systems device.

9. The method of claim 1, further comprising removing the sacrificial layer after etching the structural layer.

10. The method of claim 9, wherein providing the stack comprises:
    providing the substrate;
    after providing the substrate, adhering the sacrificial layer to the substrate;
    after adhering the sacrificial layer to the substrate, adhering the structural layer to the sacrificial layer;
    after adhering the structural layer to the sacrificial layer, adhering the etch stop layer to the structural layer;
    after adhering the etch stop layer to the structural layer, adhering the mold to the etch stop layer;
    after adhering the mold to the etch stop layer, patterning the mold using a lithography process,
    wherein the sidewall layer's second portion is thinner than a lithographic limit of the lithography process; and
    after patterning the mold, adhering the sidewall layer to the mold and to the etch stop layer.

11. A bolometer comprising:
    a glass substrate;
    a structure coupled to the glass substrate; and
    a bolometer pixel coupled to the structure,
    wherein the structure is manufactured by:
       providing a stack, wherein the stack comprises:
          a structural layer extending in a plane, a sidewall layer comprising:
  a first portion lying in a plane parallel to the structural layer plane and
  a second portion lying in a plane transverse to the structural layer plane,
an etch-stop layer, positioned between the sidewall layer and the structural layer, comprising an etch-selectivity different from an etch-selectivity of the structural layer and an etch-selectivity of the sidewall layer, and
a mold comprising a wall parallel to the sidewall layer's second portion;
positioning a sacrificial layer between the structural layer and a substrate;
etching the sidewall layer's first portion to expose the etch-stop layer;
removing the mold;
etching the etch-stop layer such that the sidewall layer's second portion masks a portion of the etch-stop layer;
removing the sidewall layer's second portion; and
etching the structural layer such that the portion of the etch-stop layer masks a portion of the structural layer.

12. The bolometer of claim 11, wherein:
the portion of the structural layer is attached to the glass substrate; and
the bolometer pixel is attached to the portion of the structural layer.

13. The bolometer of claim 11, wherein the bolometer pixel is attached to the portion of the etch stop layer.

14. The bolometer of claim 11, wherein the structure is manufactured further by removing the sacrificial layer after etching the structural layer.

15. The bolometer of claim 14, wherein providing the stack comprises:
providing the substrate;
after providing the substrate, adhering the sacrificial layer to the substrate;
after adhering the sacrificial layer to the substrate, adhering the structural layer to the sacrificial layer;
after adhering the structural layer to the sacrificial layer, adhering the etch stop layer to the structural layer;
after adhering the etch stop layer to the structural layer, adhering the mold to the etch stop layer;
after adhering the mold to the etch stop layer, patterning the mold using a lithography process,
wherein the sidewall layer's second portion is thinner than a lithographic limit of the lithography process; and
after patterning the mold, adhering the sidewall layer to the mold and to the etch stop layer.

\* \* \* \* \*